US007558641B2

(12) United States Patent
Huang et al.

(10) Patent No.: US 7,558,641 B2
(45) Date of Patent: Jul. 7, 2009

(54) RECIPE REPORT CARD FRAMEWORK AND METHODS THEREOF

(75) Inventors: Chung-Ho Huang, San Jose, CA (US); Robert Hefty, Femont, CA (US); Andrew Lui, Fremont, CA (US); Dave Humbird, Oakland, CA (US); Charles Potter, Eagle, ID (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 11/693,708

(22) Filed: Mar. 29, 2007

(65) Prior Publication Data
US 2008/0244400 A1 Oct. 2, 2008

(51) Int. Cl.
G06F 19/00 (2006.01)
G05B 13/02 (2006.01)

(52) U.S. Cl. .................. 700/108; 700/49; 700/104; 700/121; 702/81; 715/961

(58) Field of Classification Search .................. 700/49, 700/104, 108–111, 115, 121; 702/81, 82, 702/84, 182–185; 715/530, 700, 751, 961
See application file for complete search history.

(56) References Cited

U.S. PATENT DOCUMENTS

| 5,774,759 | A  | * | 6/1998  | Tanaka ............... 399/8 |
| 6,174,739 | B1 |   | 1/2001  | Steffan |
| 6,415,193 | B1 | * | 7/2002  | Betawar et al. ............. 700/97 |
| 6,446,022 | B1 | * | 9/2002  | Coss et al. .................. 72/121 |
| 6,459,949 | B1 | * | 10/2002 | Black et al. ................ 700/121 |
| 6,778,873 | B1 | * | 8/2004  | Wang et al. ................ 700/110 |
| 6,804,619 | B1 | * | 10/2004 | Chong et al. ................ 702/84 |
| 6,890,597 | B2 |   | 5/2005  | Krichnaraj et al. |
| 7,159,599 | B2 |   | 1/2007  | Verhaverbeke et al. |

OTHER PUBLICATIONS

"International Search Report", Issued in PCT Application No. PCT/US2008/058319; Mailing Date: Aug. 27, 2008.
"Written Opinion", Issued in PCT Application No. PCT/US2008/058319; Mailing Date: Aug. 27, 2008.

* cited by examiner

Primary Examiner—Sean P Shechtman
(74) Attorney, Agent, or Firm—IP Strategy Group, P.C.

(57) ABSTRACT

A computer-implemented method for performing recipe evaluation is provided. The computer-implemented method includes integrating a plurality of data sources into a single recipe report card framework. The recipe report card framework includes an editor for interacting with the plurality of data sources. The computer-implemented method also includes displaying a plurality of graphical displays. Each graphical display of the plurality of graphical displays is configured to present a signal parameter of a set of signal parameters for at least a substrate. The computer-implemented method further includes providing a plurality of criteria for each of the set of signal parameters. The computer-implemented method yet also includes providing a plurality of ranges for the each of the set of signal parameters. The computer-implemented method yet further includes providing an expert guide, which is configured to provide guidance in analyzing a recipe.

24 Claims, 7 Drawing Sheets

RECIPE REPORT CARD FRAMEWORK AND METHODS THEREOF

BACKGROUND OF THE INVENTION

Advances in plasma processing have facilitated the growth in the semiconductor industry. Recipes have long been employed by the semiconductor industry to create new devices (e.g., MEMS, chips, etc.). Different recipes may be utilized to perform substrate processing. Recipes tend to be complex and are usually created based on the knowledge and/or experience of the engineers.

Consider the situation wherein, for example, a processing system has been deployed to a device manufacturer site. Further, the manufacturer of the processing system may have incorporated best known methods to aid the device manufacturer in the creation of recipes. The device manufacture may employ the best known methods to customize recipes. In addition, the customized recipes may also be based on the knowledge and experience of the device manufacture's engineers, empirical data, a trail and error method, and the likes.

Usually, a successful execution of a recipe may be dependent upon other variables beside the recipe. Other variables may include, but are not limited to, the condition of the wafers, the chamber condition of the processing system, the wafer environment, and the likes. As a result, the engineers not only have to be knowledgeable about the recipe but may also be required to understand how the recipe may interact with other variables, such as those aforementioned.

In an example, a recipe has been created and an engineer has employed the recipe to create a plurality of devices. During the execution of the recipe, a plurality of data may be collected. The data that may be collected may be a mass collection of data points. The ability to assimilate the data, to determine which data points are critical, and/or to analyze the data in order to modify the recipe may be dependent upon the skill and experience of the engineer. For example, the engineer may be required to understand the recipe and how the recipe may interact with other variables that may affect the execution of the recipe. Unfortunately, the skill level and experience of an engineer may vary and the 'quality' of a recipe may reflect accordingly. Even if the engineer has the skill and experience, the engineer may not be able to account for the different variables in the creation of a new recipe and/or the modification of a current recipe.

In another example, a problem may arise during the execution of a recipe. The ability to analyze the data in order to debug the problem may also be dependent upon the engineer's experience and his ability to pinpoint the problem given the different variables that may cause the problem. Traditionally, the problem that may arise is usually assumed to be a hardware issue. As a result, the processing system may be taken offline in order to debug the problem. However, the cause of the problem may not always be due to the processing system. For example, about 60 percent of the de-chuck problems that may arise during execution of a recipe is usually not a hardware issue, but instead, a result of a "bad recipe". Unfortunately, by the time the processing system has been eliminated as a potential source of the problem and the recipe has been identified as the source of the problem, costly time and resources have been incurred.

BRIEF SUMMARY OF THE INVENTION

The invention relates, in an embodiment, to a computer-implemented method for performing recipe evaluation. The computer-implemented method includes integrating a plurality of data sources into a single recipe report card framework. The recipe report card framework includes an editor for interacting with the plurality of data sources. The computer-implemented method also includes displaying a plurality of graphical displays. Each graphical display of the plurality of graphical displays is configured to present a signal parameter of a set of signal parameters for at least a substrate. The computer-implemented method further includes providing a plurality of criteria for each of the set of signal parameters. The computer-implemented method yet also includes providing a plurality of ranges for the each of the set of signal parameters. The computer-implemented method yet further includes providing an expert guide, which is configured to provide guidance in analyzing a recipe.

The above summary relates to only one of the many embodiments of the invention disclosed herein and is not intended to limit the scope of the invention, which is set forth in the claims herein. These and other features of the present invention will be described in more detail below in the detailed description of the invention and in conjunction with the following figures.

BRIEF DESCRIPTION OF THE SEVERAL VIEWS OF THE DRAWINGS

The present invention is illustrated by way of example, and not by way of limitation, in the figures of the accompanying drawings and in which like reference numerals refer to similar elements and in which.

DETAILED DESCRIPTION OF EMBODIMENTS

Figure 1:
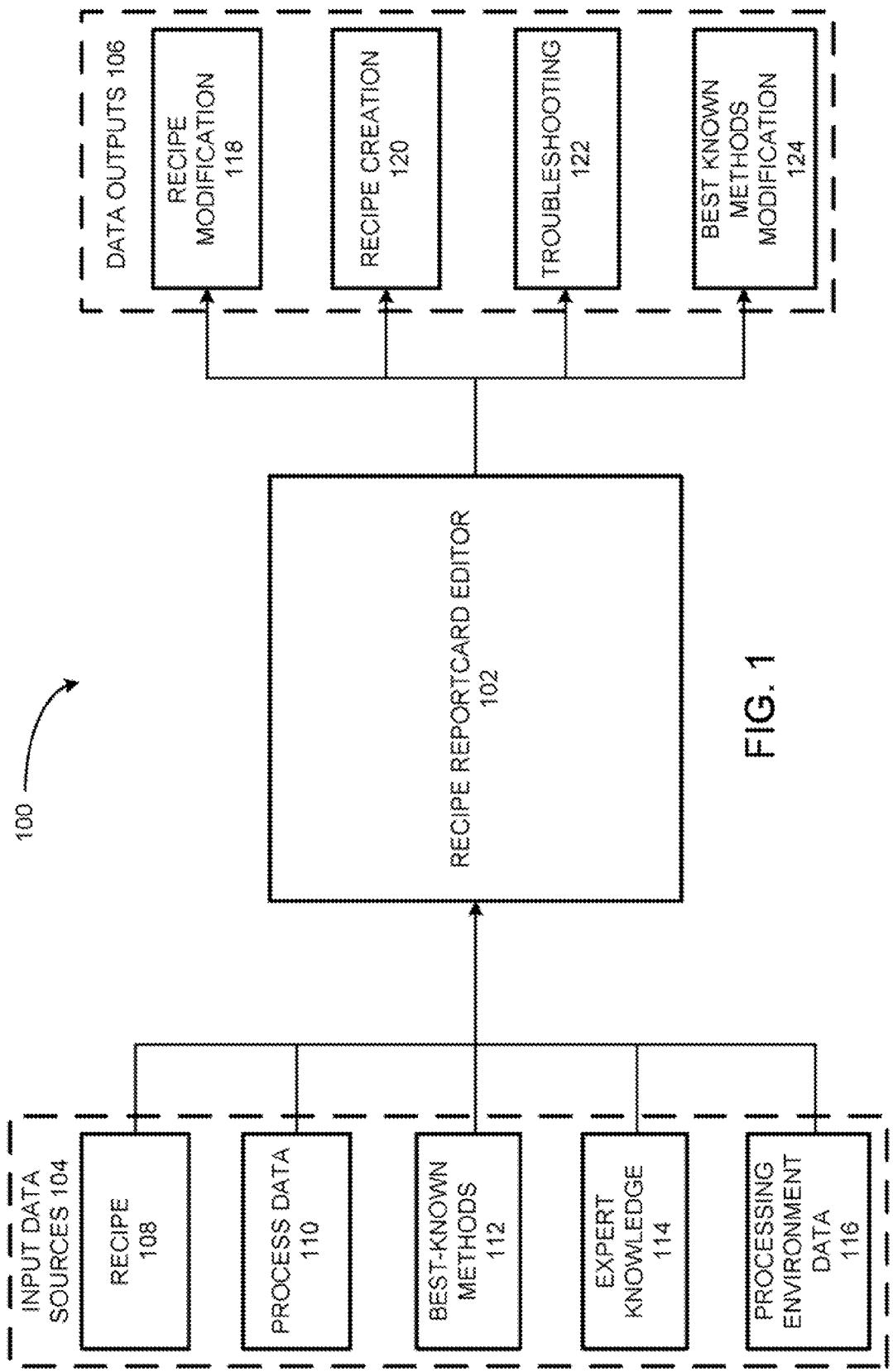
FIG. 1 shows, in an embodiment of the invention, a simple diagram of a recipe report card framework.

The present invention will now be described in detail with reference to a few embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Various embodiments are described hereinbelow, including methods and techniques. It should be kept in mind that the invention might also cover articles of manufacture that includes a computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, the invention may also cover apparatuses for practicing embodiments of the invention. Such apparatus may include circuits, dedicated and/or programmable, to carry out tasks pertaining to embodiments of the invention. Examples of such apparatus include a general-purpose computer and/or a dedicated computing device when appropriately programmed and may include a combination of a computer/computing device and dedicated/programmable circuits adapted for the various tasks pertaining to embodiments of the invention.

In one aspect of the invention, the inventors herein realized that a recipe is not created in a 'vacuum environment'. Instead, a recipe, especially a good recipe, may require the integration of knowledge, skill, and data sources from a plurality of variables (e.g., recipe, process data, historical data, etc.). Also, a good recipe may require a collaborative effort from resources both inside and outside of a company, such as a tool manufacturer, substrate manufacturer, and the likes.

In accordance with embodiments of the present invention, a computer-implemented arrangement provides a user-friendly system designed to integrate a plurality of data sources (e.g., recipe, tool data, sensor data, best known method, etc.) under a single recipe report card framework. Also, the recipe report card framework includes an interactive criteria section that enables recipe evaluation. Further, the recipe report card framework includes an expert guide, such as a help section, to provide guidance in recipe analysis. In addition, the recipe report card framework provides a collaborative infrastructure for creating, modifying, and/or validating a recipe.

In an embodiment of the invention, the recipe report card framework provides for a recipe report card editor. With the recipe report card editor, a plurality of functions may be performed. The functions may include, but are not limited to, a grading function, a guidance function, and a collaborative function.

With the grading function, a recipe may be graded based on how well the recipe may perform on a specific tool. As is well known in the art, a recipe may not always perform similarly across all tools. The difference in performance may be due to the narrow scope of the recipe. Also, the performance of the recipe may be impacted due to the varying processing environment, such as facility differences, substrate differences, tool differences, and the likes. Thus, the recipe report card editor may provide a grade for a recipe that may assist a user in determining how the recipe may be modified to account for the changes in the tools and/or processing environment, for example.

Another function that the recipe report card editor may perform is a guidance function. In an embodiment, the recipe report card may incorporate industry standards, best-known methods, expert knowledge, and/or past experience to determine the signal parameters and the criteria for each signal parameters that may affect the success of a recipe execution. Since the recipe report card editor has identified the essential elements for analyzing a recipe, an inexperience user may employ the recipe report card editor to provide guidance in analysis. In addition, the recipe report card editor may provide further guidance by including a help section. The help section may include, for example, explanation for fail criteria, possible solution for resolving the fail criteria, explanation of the criteria, and the likes.

In addition, the recipe report card editor may support a collaborative function. Generally, the process of recipe creation, modification, and/or validation is generally not performed by a single person, but by a team. In addition, the team may include members from both inside and outside the company. In an embodiment, the recipe report card editor provides a signal framework from which data may be stored, viewed, analyzed, and manipulated by a plurality of users. In an example, users who are geographically dispersed and/or located in different time zones may collaborate since all members are working within the same framework. Thus, each member is performing data analysis based on a common premise.

In order to facilitate the aforementioned functions, the recipe report card editor may integrate a plurality of input data sources (e.g., recipe, tool data, process data, best known methods, etc.) into a single location. In an embodiment, the input data sources may be uploaded into the recipe report card framework. By uploading the data into the recipe report card editor, the data may be readily available for analysis. In another embodiment, the recipe report card editor may connect with the various data sources to extract the data required for analysis. By extracting in a timely manner, the memory requirement for the recipe report card editor may be minimized.

In an embodiment of the invention, the recipe report card editor may include graphical displays of signal parameters, criteria and ranges for each of the signal parameters, and an expert guide (e.g., help section). In an embodiment, the distilled data that are presented may be chosen based on, but not limited to, expert knowledge gathered from the tool manufacturer, historical data, and/or industry standards. In an example, the recipe report card editor may display a select number of signal parameters that may have an impact on the successful execution of a recipe. For situation in which a more comprehensive analysis may be necessary, the recipe report card editor may also provide an interface for slicing-and-dicing the data.

The features and advantages of the present invention may be better understood with reference to the figures and discussions that follow.

FIG. 1 shows, in an embodiment of the invention, a simple diagram of a recipe report card framework 100. Recipe report card framework 100 may include a recipe report cart editor 102, a plurality of input data sources 104, and a plurality of data/task outputs 106. Unlike the prior art wherein analysis may be limited to the user's (e.g., process engineers, technician, etc.) knowledge, experience, and accessibility to a plurality of data sources, the inventive recipe report card framework 100 provides a simple infrastructure for integrating plurality of input data sources 104 within a single framework.

In an embodiment of the invention, plurality of input data sources 104 may be uploaded into recipe report card editor 102. Examples of plurality of input data sources 104 may include, but are not limited to, executed recipe 108, process data 110 collected by processing system components (e.g., sensors, metrology tool, processing modules, etc.), best-known methods 112 (e.g., best practices for creating recipes), expert knowledge 114, processing environment data 116 (e.g., tool ID, wafer ID, chamber ID, voltage, etc.), and the likes.

By employing recipe report card editor 102, plurality of input data sources 104 may be viewed, analyze, and/or manipulated to produce plurality of outputs 106. Plurality of outputs 106 may include reports as well as data analysis that may aid in recipe modification 114, recipe creation 116, troubleshooting 118, best-known methods modification 120, and the likes.

In an embodiment of the invention, recipe report card editor 102 may provide three functions. First, the recipe report card editor may perform a grading function. In an example, the recipe report card editor may provide details on the performance of the recipe given a specific tool.

Second, recipe report card editor 102 may perform a guidance function. In an example, the recipe report card editor may provide guidance when a problem arises by identifying the problem, the cause of the problem, and/or the possible solutions for resolving the problem. The guidance function may be possible due to the integration of prior experience and expert knowledge that may be incorporated into the recipe report card editor.

Third, recipe report card editor 102 may provide a collaborative function. In an example, the user who is incapable of completing a recipe report card for an execution of a recipe may be able to collaborate with other team members via the recipe report card editor. Thus, the recipe report card editor may provide a common framework that facilitates collaboration despite geographical distance and time zones differences.

Figure 3:
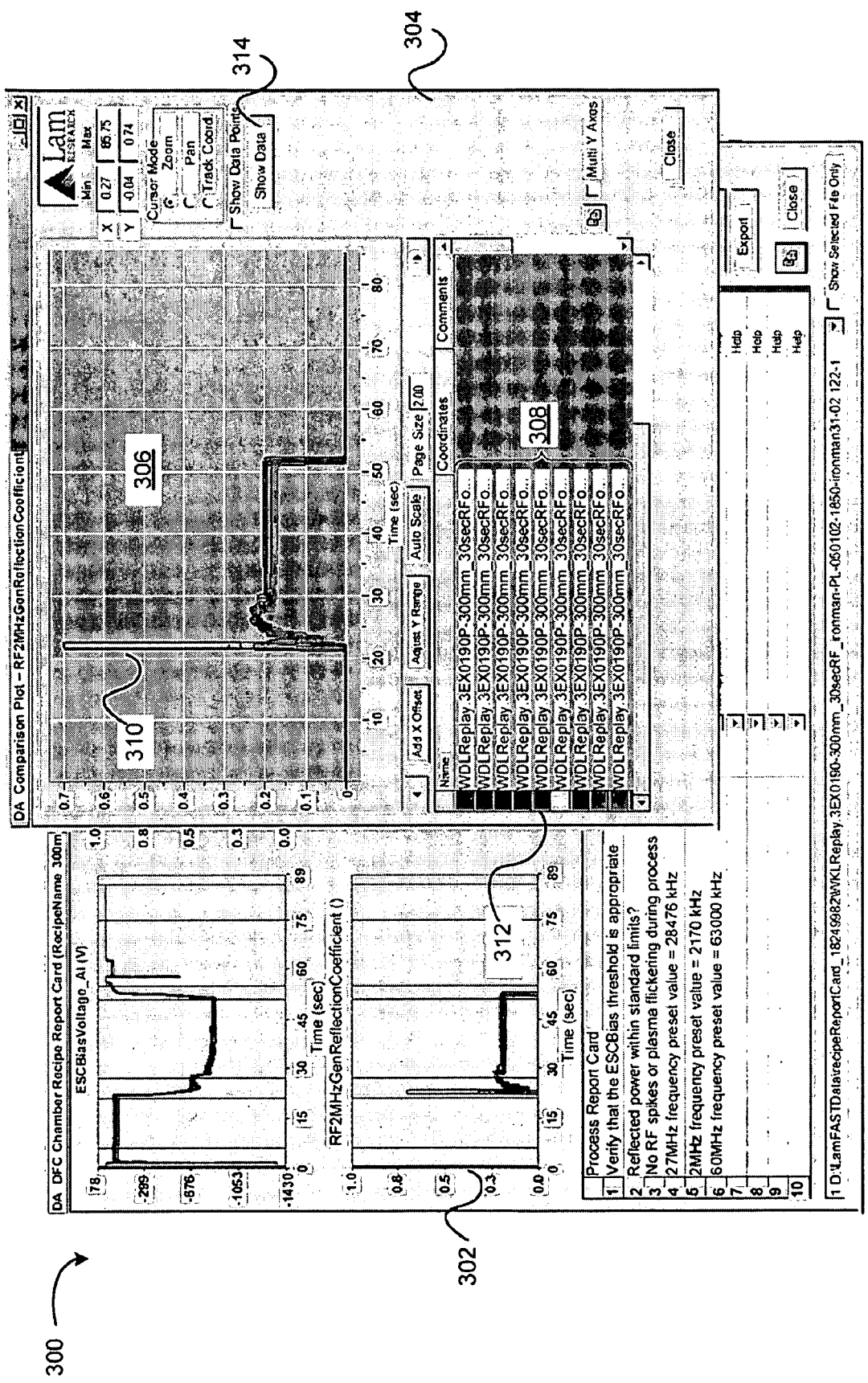
FIG. 3 shows, in an embedment of the invention, a more in-depth view of a signal trace.
Figure 4:
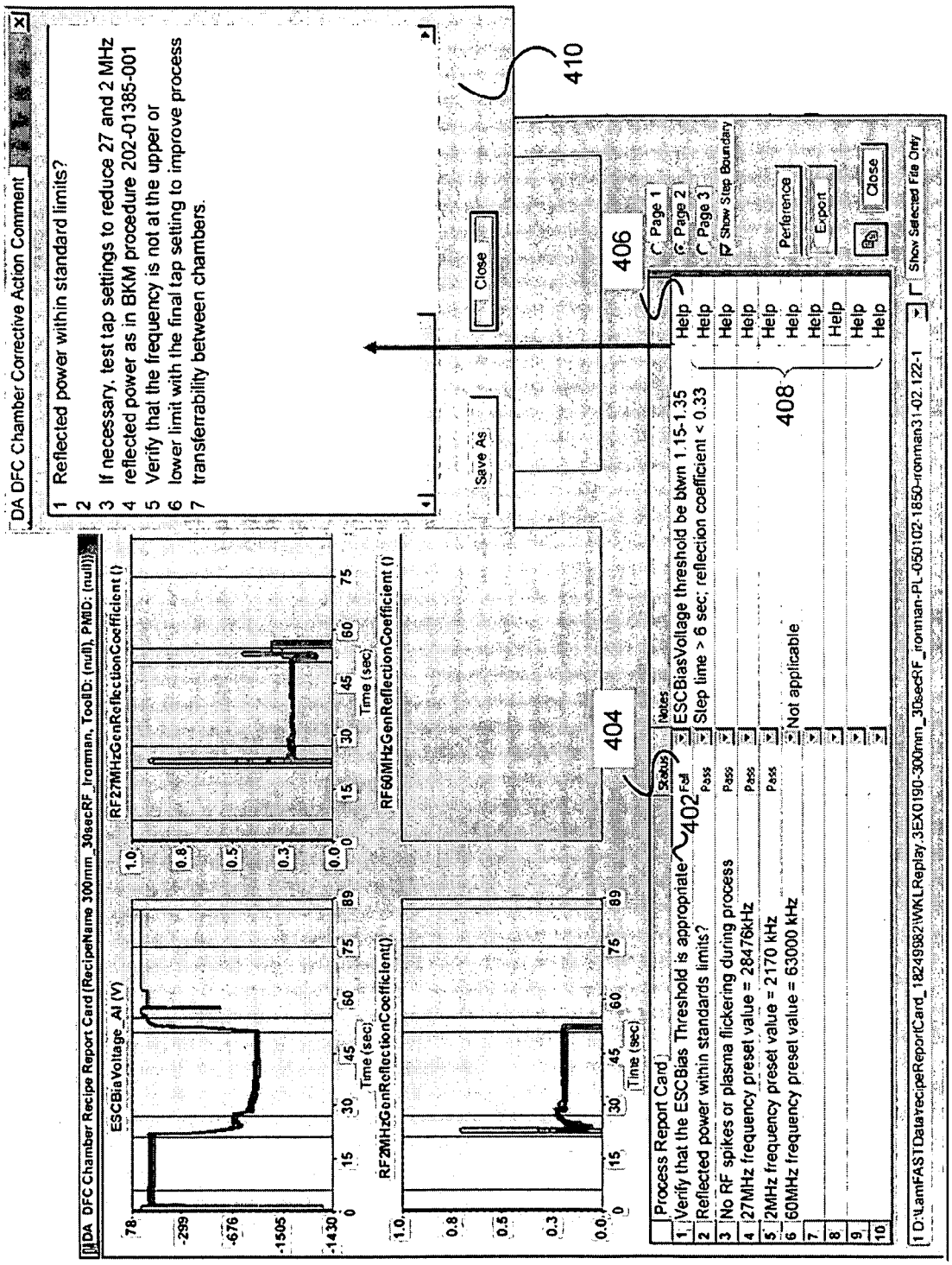
FIG. 4 shows, in an embodiment of the invention, a help view of a recipe report card interface.
Figure 5:
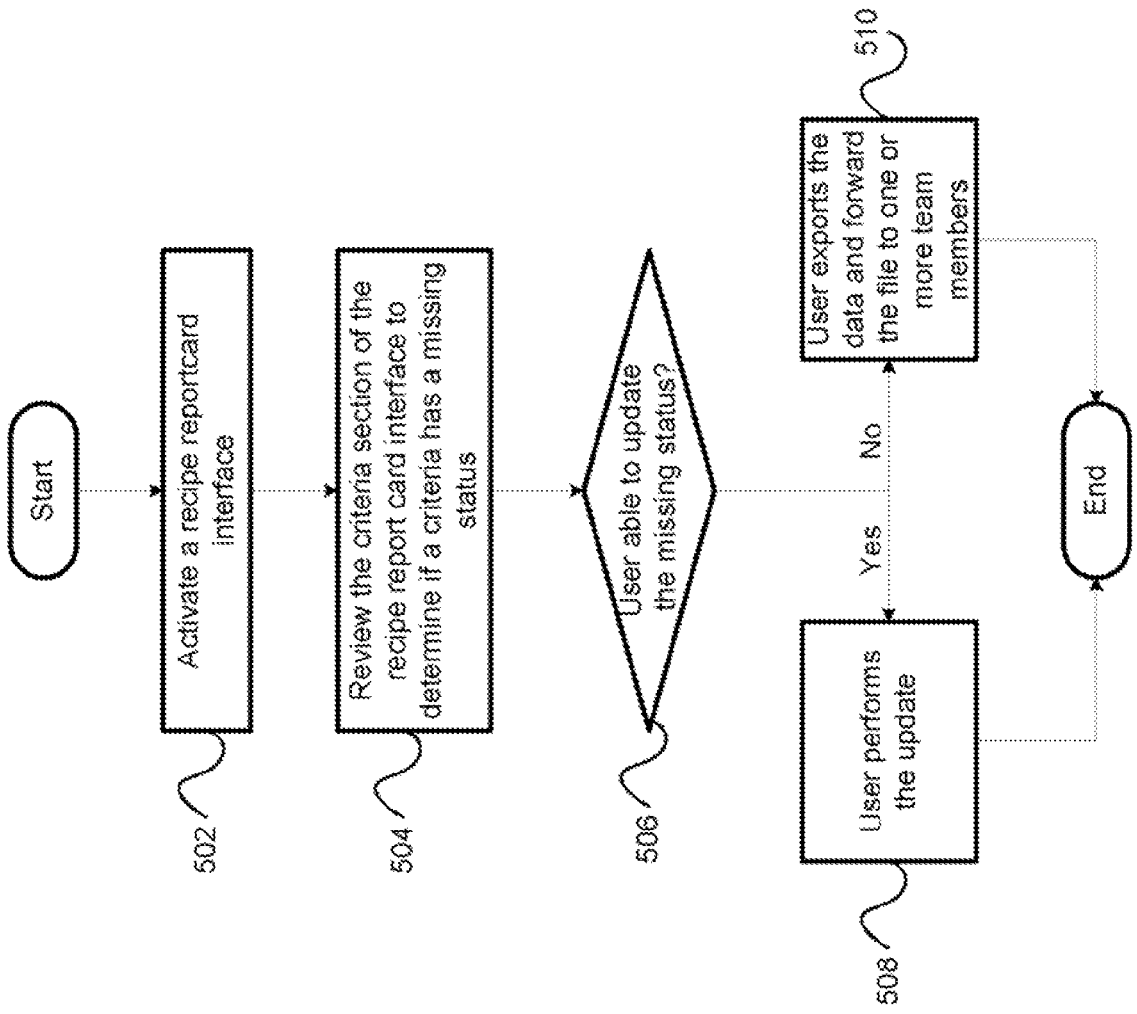
FIG. 5 shows, in an embodiment of the invention, a flow chart illustrating an example of how a recipe report card editor may be employed to facilitate collaboration.
Figure 6:
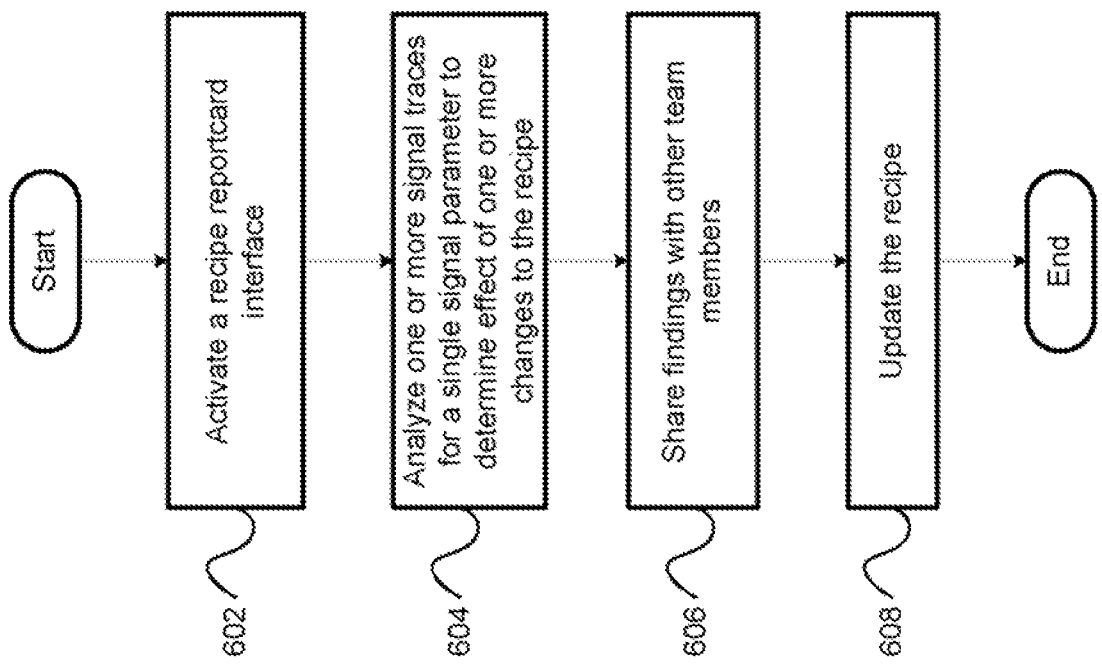
FIG. 6 shows, in an embodiment of the invention, a flow chart illustrating an example of how a recipe report card editor may be employed to facilitate creation/modification of recipe.
Figure 7:
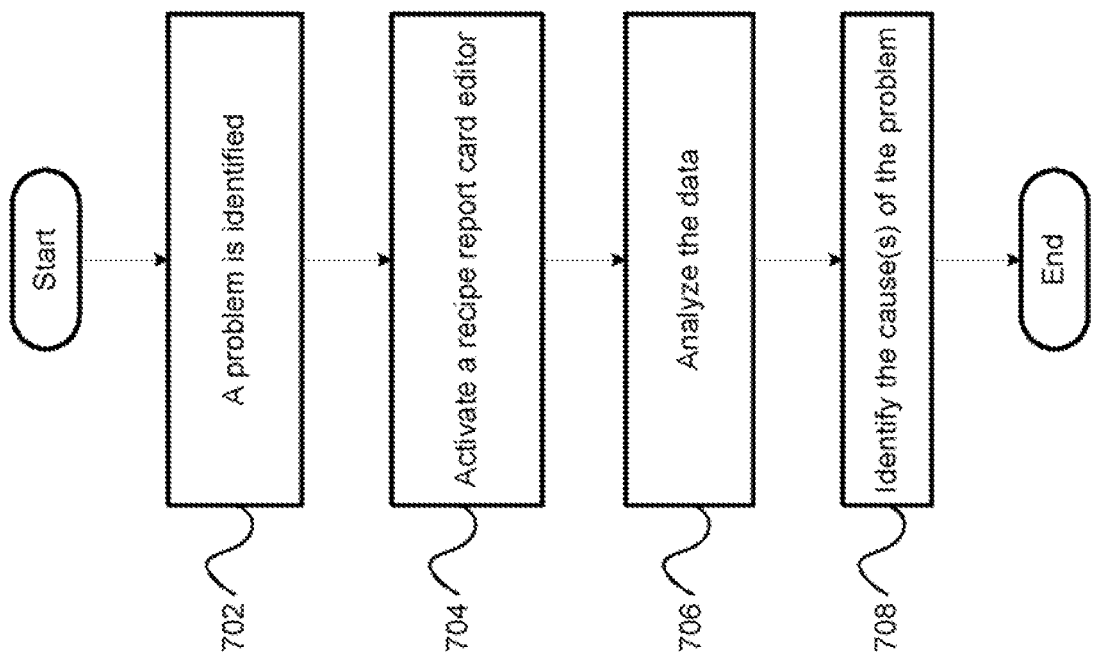
FIG. 7 shows, in an embodiment of the invention, a flow chart illustrating an example of how the recipe report card editor may be employed to facilitate troubleshooting.

The next few figures illustrate how the recipe report card editor may perform the three functions, in an embodiment. More specially, FIGS. 2-4 illustrate examples of recipe report card interfaces and FIGS. 5-7 illustrate examples of how the recipe report card editor may be applied to achieved the aforementioned functions.

Figure 2:
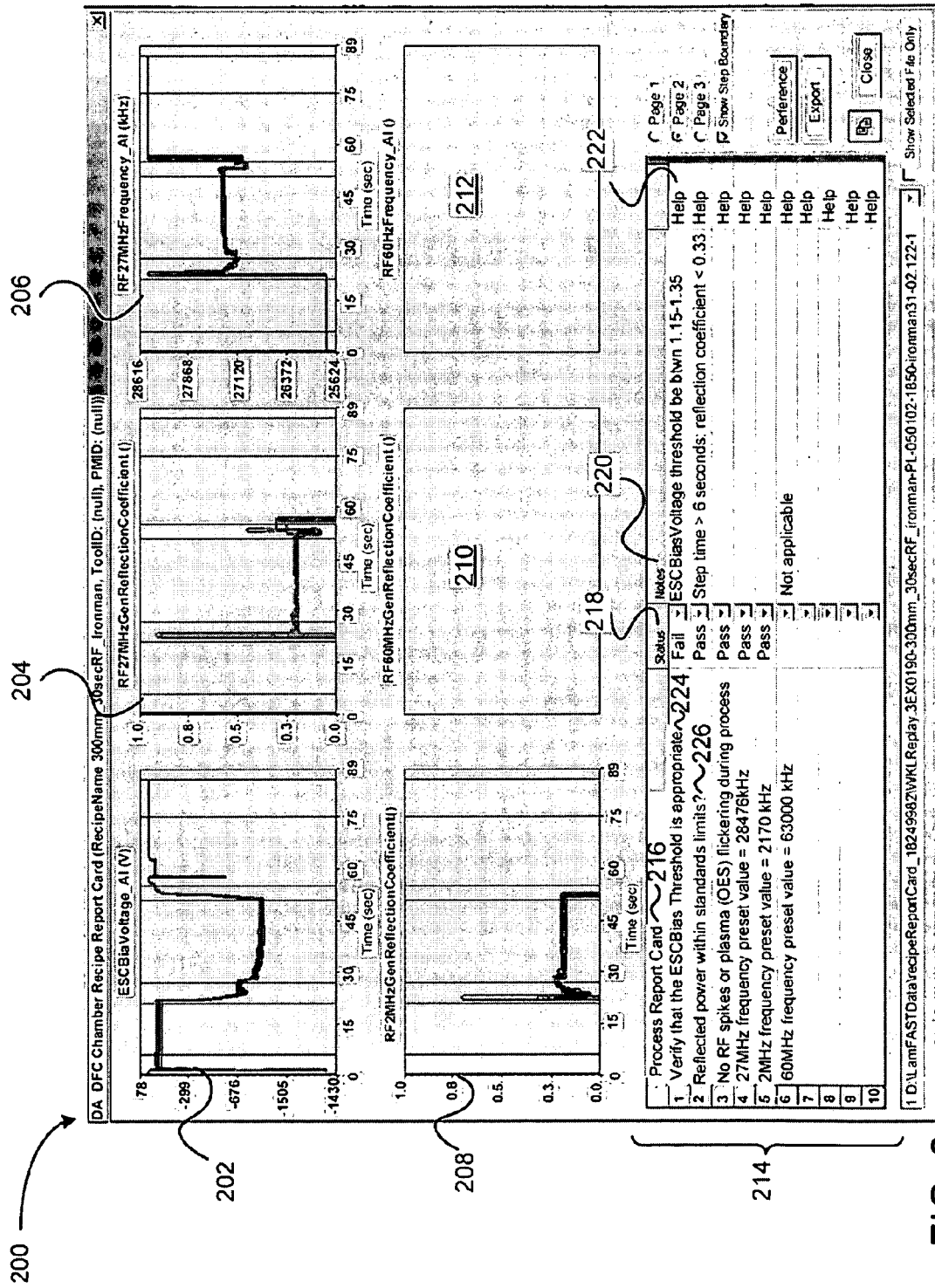
FIG. 2 shows, in an embodiment, an example of a main view of a recipe report card interface.

FIG. 2 shows, in an embodiment, an example of a main view of a recipe report card interface. In the main view, an interface 200 may include one or more graphical displays (202, 204, 206, 208, and 210). Each of the graphical displays may represent a signal trace. As discussed herein, a signal trace refers to a plethora of data that may be amassed for a signal parameter during the entire processing of a recipe. In an embodiment of the invention, each of the graphical displays may include signal traces from one or more substrates.

During the execution of a recipe, hundreds of signal parameters (e.g., bias voltage, gas pressure, radio frequency, etc.) may be collected. In the prior art, reviewing the plethora of data may require a time, resources, and experiences. Thus, inexperienced engineer may be handicapped by lack of knowledge and experience. Even if an engineer has the skill and knowledge, the engineer generally may not have the processing tool knowledge to quickly identify the signal parameters that may be relevant. As a result, most engineers may avoid data analysis until a problem arises.

Even though hundreds of signal parameters may be collected, not all signal parameters may be required to ascertain a successful execution of a recipe. In an embodiment, the signal parameters that may appear as a graphical display may be pre-defined based on expert knowledge, which may come from industry standard, recommendations from tool manufacturer, and/or experienced company technician/engineers. In an example, 100 signal parameters may be collected during execution of a recipe. However, of those 100 signal parameters, only 18 signal parameters may have been identified as critical in identifying a successful recipe execution. Thus, the recipe report card interface may only show the 18 critical signal parameters. Although 18 signal parameters may have been identified as critical, the graphical display of a signal parameter may be left blank if the data has not been collected for the signal parameter. In addition, even though only a select few of the signal parameters may be graphically displayed, the remaining signal parameters that have been collected may also be made available for analysis through the recipe report card interface if a user wants to perform a more in-depth analysis, in an embodiment.

In an embodiment, interface 200 may also include a criteria display section 214, which may include a process report card section 216, a status section 218, a note section 220, and a help section 222. Process report card section 216 may include a plurality of criteria, questions, and/or standards that may provide the user with a guideline for analyzing the recipe associated with the signal parameters collected. In an embodiment, process report card section 216 may be pre-established by the tool manufacturer based on best-known methods. In another embodiment, process report card section 216 may be established and/or modified by the company's engineers based on knowledge, experience, and criteria established by the company.

In addition, criteria section 214 may include a status section 218, which may be employed to define the condition of process report card section 216. In an embodiment, status section 218 may incorporate ranges that may define the statuses. In an embodiment, the ranges may be defined based on best-known methods. In another embodiment, the ranges may be configured based on guidelines established by a company's practices. In an embodiment, status section 218 may be automatically and/or manually entered. In an example, the recipe report card module may have an intelligence that is capable of deriving the status for each of the criteria in process report card section 216 by analyzing the data collected during the execution of the recipe. In another example, one or more criteria may require human intervention.

In an embodiment, a fail status may require the user to provide, for example, an explanation for the failure in note section 220. In an example, a criteria 224 has a status of "fail." As a result, the user may have to complete note section 220 for criteria 224. In another example, since a criteria 226 has a status of "pass," note section 220 may be optional. Note section 220 may not only provide the explanation for a status of a criteria but may also provide guidance for future analysis. In an example, a recipe is being modified. The notes from past recipe execution may provide guidance on how best to modify the recipe.

To aid in the data analysis, help section 222 may be provided. Help section 222 may include a set of help segments, which may be associated with each criteria in process report card section 214. In an embodiment, help section 222 may be employed to provide guidance on each criteria. For example, help section 222 may provide the reason why criteria 224 may have failed. In addition, help section 222 may provide instructions on how to correct a problem that may have been identified.

As aforementioned, recipe report card interface may display one or more graphical displays. For each of the graphical displays, the user may perform a more comprehensive analysis of the signal parameter. FIG. 3 shows, in an embodiment of the invention, a more in-depth view of a signal trace.

A recipe report card interface 300 may include a plurality of graphical displays of signal traces. Consider the situation wherein, for example, a user wants to perform a more comprehensive analysis of a signal trace as displayed in a graphical display 302. In an embodiment, the user may select graphical display 302 to display an in-depth view 304. In-depth view 304 may provide a zoom-in view of graphical display 302. Also, in-depth view may also define each of the signal traces that may appear on graphical display 302. In an example, a zoom-in graphical display 306 may show 25 signal traces for a given signal parameter. For each of the signal traces, a signal legend 308 may be provided. For example, a signal trace 310 is associated with a key 312 in signal legend 308. In an embodiment of the invention, the actual data collected for a signal trace may be displayed. In an example, data collected may be displayed by selecting a signal trace in zoom-in graphical display 306, selecting a key in signal legend 308, and/or selecting a show data button 314.

As aforementioned, a help section may be employed to provide guidance to the user. FIG. 4 shows, in an embodiment of the invention, a help view of a recipe report card interface. Consider the situation wherein, for example, a user may not comprehend the reason a criteria 402 may have a status 404 of "fail." By clicking on a help segment 406 of a help section 408, the user may bring up a help dialogue box 410, which may provide guidelines for the criteria and/or explanation for the fail status. In an embodiment, the knowledge displayed in help dialogue box 410 may be a collection of expert knowledge from industry standards, tool manufacturers, and/or internal engineers.

With the recipe report card framework, plurality of data sources, which may have traditionally been stored at different locations, may now be consolidated and presented in a manner that may facilitate analysis and/or collaboration. The next few figures show, in embodiments of the invention, examples of how a recipe report card framework may be employed to facilitate collaboration, creation/modification of recipe, troubleshooting, and the likes.

FIG. 5 shows, in an embodiment of the invention, a flow chart illustrating an example of how a recipe report card editor may be employed to facilitate collaboration. At a first step 502, a recipe report card interface may be activated. Consider the situation wherein, for example, a user, such as a technician, has just completed executing a recipe.

At a next step 504, the user may review the criteria section of the recipe report card interface to determine if a criteria has a missing status. In an embodiment, the recipe report card editor may have an intelligence that may enable one or more criteria to be automatically updated based on one or more of the input data sources (e.g., recipe, data collected during recipe execution, expert knowledge, best-known methods, etc.). In an embodiment, one or more criteria may require human intervention to update a status.

If a criteria has been identified with a missing status, then at a next step 506, a determination may be made on the ability of the user to update the missing status. In an embodiment, the user's log-in status may limit the ability for the user to update certain criteria field. In another embodiment, the user may make a determination that he lacks the knowledge to update the missing status.

If the user is able to update the missing status, then at a next step 508, the user may perform the update. In an embodiment, the help section may provide the user with assistance in updating the missing status.

However, if the user is unable to update the missing status, then at a next step 510, the user may export the data and forward the file to one or more team members. In an embodiment, the export file may include the data notes, the status of each criteria, and the like. In the prior art, the quality of the response from fellow team members may depend upon the ability of the user to fully describe the problem. Unlike the prior art, the data sources that may be required to perform analysis in order to update the missing status may already be incorporated into the exported file of the recipe report card. Accordingly, the recipe report card editor may facilitate team collaboration by providing a common framework from which team members located in different geographical area and different time zones may collaborate.

Upon receiving the export file, a team member may import the export file into his version of the recipe report card editor. In an embodiment, the recipe report card editor may provide an import capability to import the exported file into a member's recipe report card editor. The ability to import/export files may minimize the administrative task of managing team collaboration.

Since the recipe report card editor provides an infrastructure, the method of collaboration via the recipe report card editor provides a more superior communication and collaborative tool than collaboration via emails alone. The recipe report card editor not only provides a central depository for the data collected during execution of a recipe, but also provides the actual recipe from which data may be compared against. In addition, the recipe report card may also provides an accumulation of expert knowledge and past experience to provide the guidance to the user.

In addition, the problems and the resolution may be stored for later reference. Thus, the recipe report card editor provides a framework for promoting sharing of knowledge. As a result, the knowledge experienced by a few may be shared and future occurrence of a similar situation may benefit from the knowledge gained.

Although FIG. 5 has been discussed in term of updating a status to a criteria, the recipe report card framework collaborate capability is not limited to this example. Instead, FIG. 5 is meant as an illustrative example of how the recipe report card framework may be employed as a collaborative tool. Accordingly, the recipe report card framework provides a cost-effective tool for promoting collaboration across geographical distance and time difference. The recipe report card framework not only allows collaboration between team members within the same company but also between inter-company members, such as between engineers from device manufactures and engineers from tool manufactures.

FIG. 6 shows, in an embodiment of the invention, a flow chart illustrating an example of how a recipe report card editor may be employed to facilitate creation/modification of recipe. Consider the situation wherein, for example, a recipe has been developed by the tool manufacturer. However, at the device manufacture's production site, the recipe somehow is unable to produce the same results.

At a first step 602, a recipe report card editor may be activated. In the prior art, the task of modifying a recipe may not only be dependent upon an engineer's skill and experience, but may also be dependent upon the ability and/or willingness of the engineer to locate and analyze the different data sources. Unlike the prior art, the inventive recipe report card editor may integrate a plurality of data sources (e.g., recipe, process data, etc.) thus relieving the engineer from having to perform the arduous task of searching and locating the various different data sources. In addition, both inexperience and experience engineers may benefit from the expert knowledge, best-known methods, and/or industry standards that may be incorporated into the recipe report card editor.

At a next step 604, the user may analyze one or more signal traces for a single signal parameter. In an example, the user may have the option of analyzing one or more signal traces for a signal parameter to determine the effect of the change on the recipe. For example, the user may analyze a single trace to determine if the hardware change may have cause a criteria to fail. In another example, the user may analyze a batch of single traces to determine which signal trace may deviate from the majority.

At a next step 606, the user may collaborate with other team members. Since the process of modifying a recipe is usually not a solitary event, the user may export his findings and share his findings with his team members. As indicated in FIG. 5, the recipe report card editor provides a common framework that facilities the sharing of information. The recipe report card framework enables multiple people to work together in order to determine how best to modify the recipe. By performing recipe modification within a recipe report card framework, the recipe may benefit from the shared knowledge that characterized the inventive recipe report card framework.

At a next step 608, the current recipe may be updated with the modification. The process of modifying a recipe is simplified with the recipe report card editor since the recipe report card editor integrates the plurality of input data sources into a single source. Further, since the recipe report card interface may include a help session that integrate best-known methods and expert knowledge, the process of modifying a recipe is no longer dependent upon the knowledge and skill of a specific engineer. Thus, by employing the recipe report card framework, the recipe may be broaden to accommodate more scenario based on analysis performed by different team members and expert knowledge integrated into the framework.

FIG. 7 shows, in an embodiment of the invention, a flow chart illustrating an example of how the recipe report card editor may be employed to facilitate troubleshooting. Consider the situation wherein, for example, a processing problem may have occurred on the production floor. In the prior art, the tendency is to assume that the processing tool is the cause of the problem. As a result, time and resources may be expended to determine the problem with the tool. However, the problem may always not be associated with a hardware issue and may be related to the recipe that has been executed and/or the facility.

At a first step 702, a problem is identified.

At a next step 704, a recipe report card editor may be activated.

At a next step 706, the data may be analyzed. In the prior art, data analysis may have required the user to analyze the data file, which may include plethora of data points. Without the knowledge and the experience, an inexperience engineer may spend days, if not weeks or months on determining the cause of the problem. Even if the engineer is experience, the sheer volume of the data may require the engineer to spend a large amount of time and resources in analyzing the data.

However, the recipe report card editor has already identified the signal parameters that may cause a recipe to fail. With the report card editor, the user is able to quickly identify one or more signal parameters that may require analysis. Further, once the problematic signal parameter(s) has been identified, then the use may pull data from one or more substrates to perform a more in-depth analysis. In an example, 25 signal traces for a signal parameter are being analyzed. Of the 25 signal traces, one signal trace is significantly different from the other signal traces.

At a next step 708, one or more possible causes may be identified. In an example, an odd signal trace has been identified. A quick analysis that may be performed is to compare the recipe content between the various different substrates. If the odd signal trace has the same recipe as the other signal traces, then the recipe may be eliminated as a possibility of the cause of the problem. However, if the odd signal trace has one or more differences in the recipe, then further analysis may be performed to determine if the recipe is the cause of the problem.

In another example, if the recipe is determined to be fine and the substrate is determined to be good, then the possible cause of the problem may be a result of problem with the tool and/or facility. With the recipe and the process data, the recipe report card editor may be employed as an analysis tool to dice-and-slice the data to perform in-depth analysis and determine the source of the problem.

As can be appreciated from one or more embodiments of the present invention, the recipe report card framework provides a single interface for performing analysis on a recipe. With the recipe report card framework, a plurality of input data sources may be assimilated into a single source. Also, the recipe report card framework provides expert knowledge reducing the necessity for engineers to be an expert in all aspect of recipe development and maintenance. Thus, by centralizing recipe creation, modification, maintenance, and troubleshooting under a single framework, the recipe report card framework provides a cost-effective tool for collaboration to occur on a common premise across geographic distance and time differences.

While this invention has been described in terms of several preferred embodiments, there are alterations, permutations, and equivalents, which fall within the scope of this invention. Although various examples are provided herein, it is intended that these examples be illustrative and not limiting with respect to the invention.

Also, the title and summary are provided herein for convenience and should not be used to construe the scope of the claims herein. Further, the abstract is written in a highly abbreviated form and is provided herein for convenience and thus should not be employed to construe or limit the overall invention, which is expressed in the claims. If the term "set" is employed herein, such term is intended to have its commonly understood mathematical meaning to cover zero, one, or more than one member. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

What is claimed is:

1. A computer-implemented method for performing recipe evaluation, the computer-implemented method comprising:

integrating a plurality of data sources into a single recipe report card framework, said recipe report card framework including an editor for interacting with said plurality of data sources, said plurality of data sources including plasma processing environment data, said processing environment data including plasma processing tool data;

displaying a plurality of graphical displays, each graphical display of said plurality of graphical displays being configured to present a signal parameter of a set of signal parameters for at least a substrate;

providing a plurality of criteria for each of said set of signal parameters;

providing a plurality of ranges for said each of said set of signal parameters;

providing an expert guide, said expert guide being configured to provide guidance in analyzing a recipe;

providing a help section that includes a plurality of help segments; and providing a help dialogue box in response to a click performed by a user on a help segment in said help section, said help dialogue box providing one or more reasons for a status of one or more of said plurality of criteria, said one or more reasons being a collection of expert knowledge from at least semiconductor industry standards and semiconductor industry tool manufactures.

2. The computer-implemented method of claim 1 wherein said signal parameter is a signal trace of said substrate, said signal trace being data collected during execution of said recipe for said substrate.

3. The computer-implemented method of claim 2 wherein said plurality of criteria is based on best-known methods.

4. The computer-implemented method of claim 3 wherein said plurality of ranges is displayed as said status, said status being one of pass and fail.

5. The computer-implemented method of claim 4 wherein said recipe report card framework includes a note section, said note section being configured to provide said user with a location for providing explanation for said status.

6. The computer-implemented method of claim 5 further comprising providing said expert guide in reaction to said click performed by said user, wherein said expert guide includes instructions for actions to be taken by said user for handling a problem for each criteria of said plurality of criteria.

7. The computer-implemented method of claim 1 further including providing a plurality of data outputs, said data outputs including reports.

8. The computer-implemented method of claim 1 wherein said recipe report card framework is configured to provide a collaborative function, said collaborative function facilitating collaboration between a set of users.

9. The computer-implemented method of claim 1 further comprising providing a grade for said recipe through said editor, said grade grading performance of said recipe.

10. An article of manufacture comprising a program storage medium having computer readable code embodied therein, said computer readable code being configured to perform recipe evaluation, the article of manufacture comprising:
    code for integrating a plurality of data sources into a single recipe report card framework, said recipe report card framework including an editor for interacting with said plurality of data sources, said plurality of data sources including plasma processing environment data, said processing environment data including plasma processing tool data;
    code for displaying a plurality of graphical display of a set of signal parameters from said plurality of data sources;
    code for providing a plurality of criteria for each of said set of signal parameters;
    code for providing a plurality of ranges for said each of said set of signal parameters; and
    code for providing an expert guide, said expert guide being configured to provide guidance in analyzing a recipe;
    code for providing a help section that includes a plurality of help segments; and
    code for providing a help dialogue box in response to a click performed by a user on a help segment in said help section, said help dialogue box providing one or more reasons for a status of one or more of said plurality of criteria, said one or more reasons being a collection of expert knowledge from at least semiconductor industry standards and semiconductor industry tool manufactures.

11. The article of manufacture of claim 10 wherein said signal parameter is a signal trace of a substrate, said signal trace being data collected during execution of said recipe for said substrate.

12. The article of manufacture of claim 11 wherein said plurality of criteria is based on best-known methods.

13. The article of manufacture of claim 12 wherein said plurality of ranges is displayed as said status, said status being one of pass and fail.

14. The article of manufacture of claim 13 wherein said recipe report card framework including code for providing a note section, said note section being configured to provide said user with a location for providing explanation for said status.

15. The article of manufacture of claim 14 further comprising providing said expert guide in reaction to said click performed by said user, wherein said expert guide includes instructions for actions to be taken by said user for handling a problem for each criteria of said plurality of criteria.

16. The article of manufacture of claim 10 further including code for providing a plurality of data outputs, said data outputs including reports.

17. The article of manufacture of claim 10 wherein said recipe report card framework is configured to provide a collaborative function, said collaborative function facilitating collaboration between a set of users.

18. The article of manufacture of claim 10 wherein said recipe report card framework is configured to perform a grading function, said grading function including information about the performance of said recipe.

19. The article of manufacture of claim 10 wherein said plasma processing environment data includes a plasma processing tool identifier and a plasma processing chamber identifier.

20. The article of manufacture of claim 10 wherein said set of signal parameters includes a gas pressure and a radio frequency.

21. The article of manufacture of claim 10 wherein said expert guide is further configured to provide guidance for modifying said recipe.

22. The article of manufacture of claim 10 further comprising code for showing a plurality of signal traces for a given signal parameter of said set of signal parameters.

23. The article of manufacture of claim 10 further comprising:
    code for incorporating at least a portion of said plurality of data sources into a file; and
    code for exporting said file.

24. The article of manufacture of claim 23 further comprising code for importing said file into a second editor.

* * * * *